(12) United States Patent
Usoskin et al.

(10) Patent No.: US 8,275,431 B2
(45) Date of Patent: Sep. 25, 2012

(54) TAPE-TYPE SUPERCONDUCTOR WITH ANISOTROPY OF CRITICAL CURRENTS

(75) Inventors: Alexander Usoskin, Hanau (DE); Klaus Schlenga, Linkenheim (DE)

(73) Assignee: Bruker HTS GmbH, Hanau (DE)

( * ) Notice: Subject to any disclaimer, the term of this patent is extended or adjusted under 35 U.S.C. 154(b) by 0 days.

(21) Appl. No.: 13/064,885

(22) Filed: Apr. 25, 2011

(65) Prior Publication Data

US 2011/0263432 A1    Oct. 27, 2011

(30) Foreign Application Priority Data

Apr. 26, 2010   (EP) .................................. 10161064

(51) Int. Cl.
    *H01L 39/24*   (2006.01)
(52) U.S. Cl. ...................................... 505/230
(58) Field of Classification Search .............. 505/230, 505/237, 238, 166, 211; 428/699–702
    See application file for complete search history.

(56) References Cited

U.S. PATENT DOCUMENTS

| | | | |
|---|---|---|---|
| 2003/0155990 A1* | 8/2003 | Ye .................................. | 333/99 S |
| 2010/0006825 A1* | 1/2010 | Wakana et al. ................. | 257/31 |
| 2010/0264312 A1* | 10/2010 | Koshelev et al. ........... | 250/338.4 |
| 2011/0270557 A1* | 11/2011 | Choi et al. ....................... | 702/65 |

FOREIGN PATENT DOCUMENTS

| | | |
|---|---|---|
| EP | 0 465 326 | 8/1995 |
| EP | 2 131 407 | 12/2009 |
| WO | WO 03/065467 | 8/2003 |

OTHER PUBLICATIONS

Eickeemyer J. et al., "Elongated grains in textured substrate tapes and their effect on transport currents in superconductor layers", Applied Physics Letters, AIP, American Institute of Physics, Melville, NY, US, vol. 90, No. 1, Jan. 5, 2007.
Barnes P, et al. "Low AC Loss Structures in YBCO Coated conductors With Filamentary Current Sharing", IEEE Transactions on Applied Superconductivity, IEEE Service Center, Los Alamitos, CA, US, vol. 15, No. 2, Jun. 1, 2005.
Wang, L.B. et al., "Mapping the current distribution in YBa2Cu3O7-x thin films with striations", Physica C, Nort-Holland Publishing, Amsterdam, NL, vol. 419, No. 3-4, Mar. 1, 2005.
Usoskin, A. et al., "Processing of Long-Length YBCO Coated Conductors Based on Stainless Steel Tapes", IEEE Trans. on App. Supercond, 17 (2), pp. 3235-3238, Jun. 2007.

* cited by examiner

*Primary Examiner* — Colleen Dunn
(74) *Attorney, Agent, or Firm* — Paul Vincent

(57) ABSTRACT

A tape-type superconductor (1), comprising an elongated substrate (2), in particular a metal tape, and a continuous superconducting layer (3), in particular of a HTS type material, deposited on the substrate (2), is characterized in that $I_c^{\|}/I_c^{\perp} \geq 1.5$, with $I_c^{\|}$ being the width density of critical current of the continuous superconducting layer (3) in parallel to the substrate (2) and in parallel to the elongated direction of the substrate (2), and with $I_c^{\perp}$ being the width density of critical current of the continuous superconducting layer (3) in parallel to the substrate (2) and perpendicular to the elongated direction of the substrate (2). The tape-type superconductor has reduced ac losses.

18 Claims, 6 Drawing Sheets

TAPE-TYPE SUPERCONDUCTOR WITH ANISOTROPY OF CRITICAL CURRENTS

This application claims Paris convention priority of EP 10 161 064.0 filed Apr. 26, 2010 the entire disclosure of which is hereby incorporated by reference.

BACKGROUND OF THE INVENTION

The invention relates to a tape-type superconductor, comprising
an elongated substrate, in particular a metal tape, and
a continuous superconducting layer, in particular of a HTS type material, deposited on the substrate.

Such a superconductor is known from A. Usoskin et al., IEEE Trans. On App. Supercond. 17 (2), pages 3235-3238 (2007).

Superconductors may transport electric currents without ohmic losses. However, in practice, superconductors may experience other types of losses. These losses heat up the superconductor, what may cause the superconductor to become normally conductive when the critical temperature $T_c$ is reached. Even when the superconductor stays superconductive, losses increase the cooling costs (e.g. the consumption of liquid helium or liquid nitrogen) for keeping the superconductor below $T_c$. Therefore, in general, superconductors with low losses are preferred.

Losses in superconductors may be caused, in particular, by hysteretic effects. When a superconductor experiences a magnetic field, the superconductor squeezes out magnetic flux lines ("perfect diamagnetism"), wherein current loops are induced in the superconductor, generating an opposing magnetic field. When the magnetic field changes, the current loops vanish again and dissipate their energy, what heats up the superconductor, and other current loops are induced.

Superconductors may experience alternating (changing) magnetic fields for a number of reasons, for example the superconductor may be operated near a rotating magnet (e.g. in a motor), or the superconductor carries an alternating current (ac current) what causes an alternating self field in the vicinity of the superconductor.

In order to reduce losses in superconductors due to alternating magnetic fields ("ac losses"), it has been proposed to break up a superconductor into small filaments, compare EP 2 131 407 A1. This approach works well for low temperature superconductor materials, wherein filaments may be easily embedded in a metal matrix.

For high temperature superconductor (HTS) materials with a critical temperature $T_c$ of above 30 K, in particular ceramic superconductor materials, it is common to prepare tape-type superconductors (also called coated conductors), wherein a superconducting layer is deposited onto an elongated non-superconducting substrate (such as a stainless steel tape of several meters length), typically by MOCVD (metal organic chemical vapour deposition), MOD (metal organic deposition) or PLD (pulsed laser deposition). It would be rather difficult to prepare separate stripes of superconducting material on the elongated substrate in these procedures.

EP 0 465 326 B1 reports on an epitaxial YBCO film deposited on a SrTiO3 single crystal substrate, exhibiting a magnetic field induced anisotropy in critical current density. A multilayer structure is proposed to eliminate the magnetic field induced anisotropy.

It is the object of the invention to provide a tape-type superconductor with reduced ac losses.

SUMMARY OF THE INVENTION

This object is achieved, in accordance with the invention, by a tape-type superconductor as introduced in the beginning, characterized in that $$I_c^\| / I_c^\perp \geq 1.5$$

with $I_c^\|$ being the width density of critical current of the continuous superconducting layer in parallel to the substrate and in parallel to the elongated direction of the substrate, and with $I_c^\perp$ being the width density of critical current per of the continuous superconducting layer in parallel to the substrate and perpendicular to the elongated direction of the substrate.

The width density of critical current denotes here the critical current per unit width of the continuous superconducting layer. The later value is also routinely expressed in terms of critical current per centimetre width of the superconducting layer.

The inventors found out that superconducting layers exhibiting an anisotropy of width density of critical currents show a different ac loss behaviour as compared to isotropic superconducting layers.

When the superconducting layer (film) is exposed to a low alternating magnetic field strength, losses are a relatively low in both anisotropic and isotropic superconducting layers, with slightly higher losses in the anisotropic superconducting layer. In case of a relatively large alternating magnetic field strength, the losses increase in both the isotropic and the anisotropic superconducting layer. However, in the anisotropic superconducting layer, the increase of losses is less pronounced, so that ac losses in anisotropic superconducting layers are considerably below the ac losses in an anisotropic sample of the same size. The inventors obtained a loss reduction of up to a factor of 2-3 in a number of experiments.

Accordingly, the present invention proposes to introduce an anisotropy of critical currents per cm width in the superconducting layer of a tape type (band type) superconductor. In general, in order to maintain a high current carrying capacity of the superconductor, the higher critical current per cm width should be along the elongated substrate direction, and the lower critical current should be across the width of the substrate.

The effect of reduction of ac losses in anisotropic superconducting layers in high fields was found experimentally as a very reproducible result. The result is unexpected regarding many theoretical aspects in particular considering substantial coupling losses if the superconductor is described in terms of a multifilament model. Nevertheless, the inventors quote below one of possible explanation of the given effect. Assuming that the difference in width densities of critical current causes a difference in flux creep dissipation for different directions of induced current flow. Consequently, there is a different energy dissipation due to the finite resistivity stemming from anisotropic flux creep, occurring at currents smaller than $I_c$ (compare EUNGUK LEE, AC LOSS IN SUPERCONDUCTING COMPOSITES: CONTINUOUS AND DISCRETE MODELS FOR ROUND AND RECTANGULAR CROSS SECTIONS, AND COMPARISONS TO EXPERIMENTS, The Ohio State University, 2004, p. 11 and FIG. 1.8 in p. 21). Because of relatively high n-values (30-50) in the considered type of superconductors, rather small (e.g. by a factor of 2) differences in the width densities of critical current may cause a high (say by a factor of 10-100) difference in an "effective residual resistance" of the continuous superconducting layer in different directions. Particularly the residual resistance becomes significantly higher in the direction which is perpendicular to the elongated direction of the substrate because the width density of the circular current is nearing quicker to the critical value that for "longitudinal" current. As a result the current density in current loops is suppressed, and the total effect of energy dissipated reduces.

The width densities of critical current may be measured in self-field in single and straight superconductor tape with 2-4 mm width. The lower $I_c^\perp$ as compared to $I_c^\parallel$ is present at least when measuring $I_c^\perp$ across the complete tape width, and preferably also when measuring across at least one fifth of the complete tape width. Most preferably, the anisotropy can be measured at any fraction of the tape width.

In accordance with the invention, a variation, in particular a periodic variation, of the thickness of the superconducting layer and/or of the width density of critical current $Ic^\perp$ across the tape width ("perpendicular" direction) may be established in order to obtain the anisotropy of critical currents per cm width of the continuous superconducting layer as a whole.

A superconducting layer with an in-plane anisotropy of critical currents may be manufactured, for example, by depositing YBCO on a stainless steel tape as a substrate after the substrate has been polished with a preferential direction in parallel to the elongated direction of the substrate; for details see below. It should be noted that an expert in the field may find other ways to manufacture a superconducting layer with an anisotropic critical current per cm width distribution.

The invention is particularly suited for high temperature superconductor material with a critical temperature of more than 30 K to be deposited on the substrate. Note that typically the superconducting layer is grown almost epitaxially, at least at a high degree texture on the substrate (which is typically polycrystalline or amorphous) in accordance with the invention, and the substrate is typically flexible.

In an advantageous embodiment of the inventive tape type superconductor, $$I_c^\parallel/I_c^\perp \geq 3,$$

preferably $I_c^\parallel/I_c^\perp \geq 5$, most preferably $I_c^\parallel/I_c^\perp \geq 8$. For these higher degrees of anisotropy, reduced ac losses can be realized over a wider range of magnetic field strengths.

In a particularly preferred embodiment, the superconducting layer has a maximum thickness variation of 30% or less, preferably 15% or less, most preferably 5% or less, as compared to the maximum thickness. In case of a uniform thickness of the superconducting layer, the anisotropy of width densities of critical current results from an anisotropy of critical current densities along the two orthogonal in-plane directions.

In an alternative embodiment, the continuous superconducting layer exhibits a thickness variation, in particular a periodic thickness variation, in parallel to the substrate and perpendicular to the elongated direction of the substrate of at least 50%, preferably at least 80%, most preferably at least 90%, as compared to the maximum thickness. By this means, a superconducting material with homogeneous characteristics can also result in the required anisotropy of width densities of critical current. If the thickness variations are periodic, at least 5 periods across the tape width are preferred.

Preferred is an embodiment wherein the continuous superconducting layer has a thickness of 50 μm or less, preferably 10 μm or less, most preferably 2 μm or less. These sizes have been found useful in practice.

Also preferred is an embodiment wherein the continuous superconducting layer has a length along the elongated direction of the substrate of 20 cm or more, preferably 1 m or more, most preferably 100 m or more, and a width perpendicular to the elongated direction of the substrate of 1.5 mm or more, preferably 4 mm or more, most preferably 12 mm or more. These sizes have also been found useful in practice. In general, in accordance with the invention, the substrate has an aspect ratio of at least 5, preferably of at least 10, and typically of 100 or more. The superconductor or the substrate, respectively, are typically coiled for storage, transport and processing.

In an advantageous embodiment, there is a at least one buffer layer arranged between the elongated substrate and the continuous superconducting layer, in particular wherein the at least one buffer layer comprises a dielectric or insulating material, preferably based on oxides or nitrides such as yttria stabilized zirconia. Buffer layers may improve the quality of the deposited superconducting layer, in particular increase the critical current per cm width $I_c^\parallel$ in the elongated direction of the substrate. Preferred buffer materials are yttria stabilized zirconia, magnesium oxide, ceria, aluminia, titan nitride, yttria or their combinations. The buffer layer may be in-plane textured, for instance using alternating ion beam deposition.

Preferred is an embodiment wherein the continuous superconducting layer comprises $ReBa_2Cu_3O_{7-X}$, with Re being Y or a rare earth element. X is a correction factor of the oxygen index varying from 0.05 to 0.8. ReBCO materials exhibit a particularly high critical temperature $T_c$, and may be deposited on steel tapes at high quality.

In another preferred embodiment, the superconductor comprises a protection layer and/or a shunt layer. This prevents damages to the superconducting layer and/or may subdue the influence of hot spots and equalize potential differences between the superconducting layer and the substrate.

In an advantageous embodiment, the elongated substrate is a non-magnetic stainless steel tape, in particular a CrNi stainless steel tape, and in particular having a thickness of between 0.02 mm and 0.24 mm. Stainless steel tapes are inexpensive and provide good flexibility to the superconductor.

Also within the scope of the present invention is the use of a superconductor, in particular of an inventive superconductor as described above, wherein the superconductor comprises a continuous superconducting layer, in particular of a HTS type material, deposited on a substrate, wherein the superconductor is used in an alternating magnetic field B having a component perpendicular to the substrate, characterized in that the continuous superconducting layer has an anisotropy of width densities of critical current with respect to two orthogonal directions in parallel with the substrate of 1.5 or larger, in particular 3 or larger, more particularly 5 or larger, most particularly 8 or larger. When using a (typically tape-type) superconductor with a superconducting layer exhibiting an anisotropy of the width density of critical current (i.e. an anisotropy of the critical current per cm width) in an alternating magnetic field, ac losses within the superconducting layer can be tailored and in particular reduced. Preferably, the superconductor is used in a situation wherein the alternating magnetic field B has led to nearing of the width density of critical current to the critical value which relates to one of the orthogonal in-plane directions regarding the substrate, but not to the out-of-plane one. The anisotropy is measured as the ratio of critical currents per cm width of the two orthogonal directions which are in-plane directions regarding the substrate. The alternating magnetic field may be an external magnetic field, or a self-field which appears when an ac current is transported through the superconductor; typical alternation frequencies are 20 Hz and higher. Note that the orientation of the alternating magnetic field B is to be considered at some distance from the superconductor, since the superconducting layer (before it becomes "transparent" to the field flux) will deflect the magnetic field at its surface towards a parallel orientation with respect to its surface.

A preferred variant of the above use provides that the alternating magnetic field B originates at least partially from an ac current flow the superconductor is exposed to. Such a self-field is practically inevitable when the superconductor or its superconducting layer is used to transport an ac current. The invention helps to reduce ac losses due to this self-field.

In a preferred variant of the above use, at least in some areas around the superconductor, the alternating magnetic field comprises an essential component that is perpendicular to the substrate plane. In such a situation, ac losses may be particularly high, and thus the invention may reveal its full potential.

Further preferred is a use variant wherein under the effect of the alternating magnetic field B, the degree of anisotropy is larger as compared to without the effect of the alternating magnetic field B. In this case, a good loss reduction can be achieved for relatively low alternating magnetic field strengths.

Preferred is also a use variant, wherein the superconductor is used in
- an electrical rotating machine such as a motor or a generator,
- an electrical drive such as a linear motor,
- a transformer,
- a resistive or inductive superconducting fault current limiter,
- a superconducting magnet,
- or a superconducting cable. In these applications, ac losses may be particularly relevant.

Further within the scope of the present invention is a method for designing AC losses of an alternating magnetic field B in a superconductor, in particular an inventive superconductor as described above, wherein the superconductor comprises a continuous superconducting layer, in particular of a HTS type material, deposited on a substrate, and the alternating magnetic field B has a component perpendicular to the substrate, characterized in that the continuous superconducting layer is prepared with an anisotropy of width densities of critical current with respect to two orthogonal directions in parallel to the substrate such that a desired level of ac losses is achieved in the continuous superconducting layer. The method uses the dependency of ac losses on the degree of anisotropy. Note that the anisotropy may be used both to increase losses (at low field strengths) or to decrease losses (at high field strengths).

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawing.

DESCRIPTION OF THE PREFERRED EMBODIMENT

Figure 1:
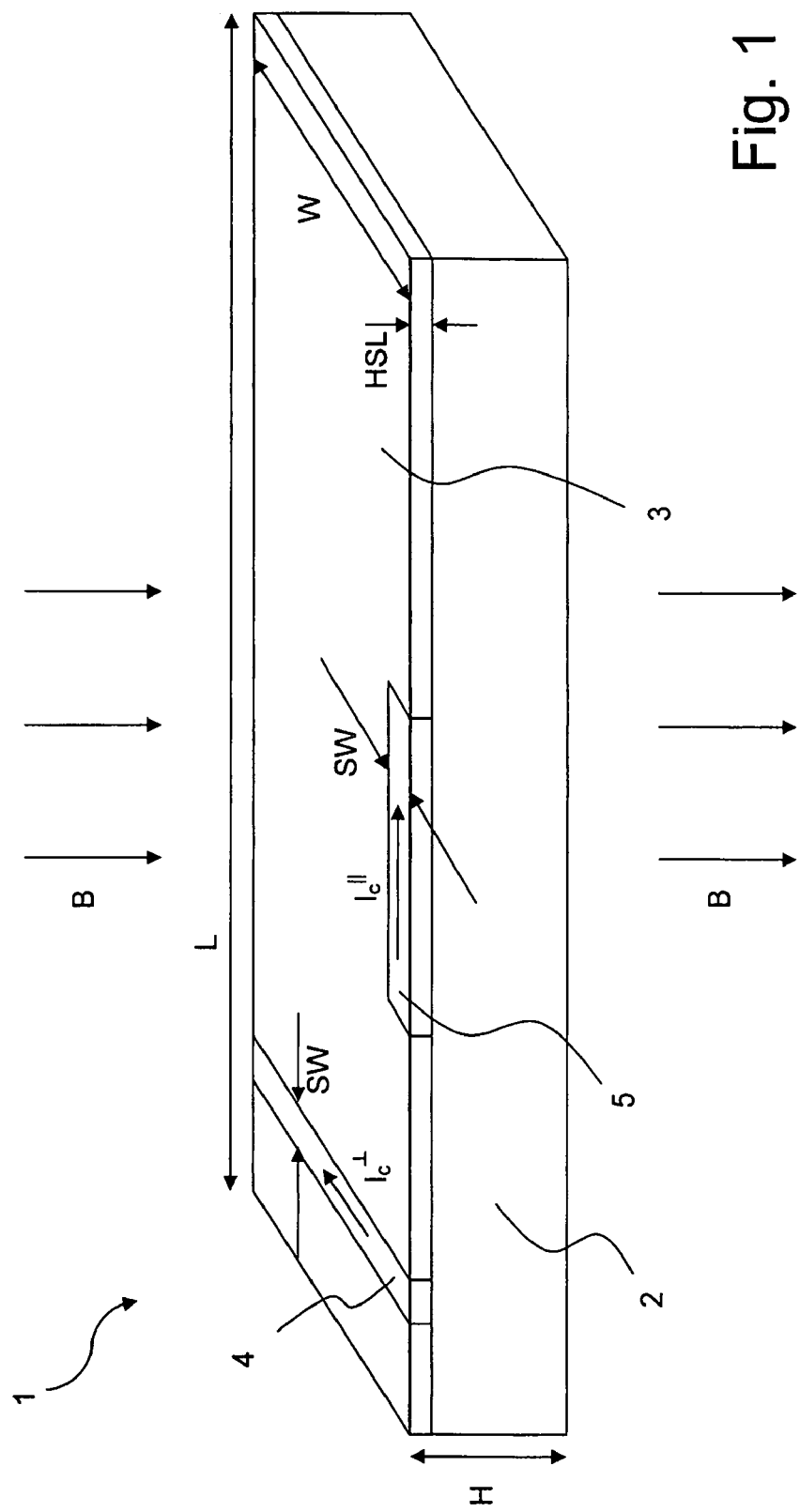
FIG. 1 shows schematically an inventive tape-type superconductor, used in an alternating magnetic field B.

FIG. 1 illustrates schematically an inventive tape-type superconductor 1, comprising a substrate 2 and a continuous (non-intermittent) superconducting layer 3 deposited on the substrate 2. Note that FIG. 1 (just as the following figures) is not to scale. Typically, the height H of the total superconductor 1 is typically about 100-200 μm, whereas the height HSL of the superconducting layer is typically about 2 μm. The substrate 2 (and thus also the superconducting layer 3 which covers the substrate completely here) has a length L along an elongated direction (also referred to as "parallel" direction) here from left to right, and a width (or tape width) W perpendicular to the elongated direction (also referred to as "perpendicular" direction). Typically, the length L is on the order from several meters to several tens of meters, and the tape width W is on the order of several centimeters (and typically not more than 10 cm).

According to the invention, the superconducting layer 3 has an anisotropy of width densities of critical current (also called critical currents per unit width). In order to determine this anisotropy, the critical current (i.e. the current at which the voltage drop across the sample width reaches 1 mV/cm; measurements are performed at boiling temperature of liquid nitrogen, i.e. at T=77 K; this temperature was below critical temperature, $T_c$, which was of 90 K) may be measured along two stripes 4, 5, each of a defined stripe width SW, wherein the stripes 4, 5 extend over the full thickness (height HSL) of the deposited superconducting layer 3 (and usually also over the substrate height, what is irrelevant for the critical current, though). The stripes 4, 5 are typically cut out for measurement. One stripe 5 extends in the elongated direction of the substrate 2, and one stripe 4 extends perpendicular to said elongated direction.

The measured critical currents are scaled with the respective strip width SW, resulting in $I_c^{\parallel}$ and $I_c^{\perp}$, with $I_c^{\parallel}$ and $I_c^{\perp}$ being the width densities of critical current, i.e. the critical currents per cm width of the continuous superconducting layer 3 in parallel to the substrate 2 and in parallel to the elongated direction of the substrate 2 or perpendicular to the elongated direction of the substrate 2, respectively.

In accordance with the invention, $I_c^{\parallel}/I_c^{\perp} \geq 1.5$, preferably $I_c^{\parallel}/I_c^{\perp} \geq 3$, more preferably $I_c^{\parallel}/I_c^{\perp} \geq 5$, and most preferably $I_c^{\parallel}/I_c^{\perp} \geq 8$. Note that strip 5 does not need to extend along the full length L of the substrate 2, and strip 4 also does not need to extend along the full width W of the continuous superconducting layer 3 (although shown here this way). The lengths of the stripes 4, 5 as well as the stripe widths SW have to be large enough such that the stripes 4, 5 reflect the average properties of the superconducting layer 3, though. In general, stripe sizes of 20×3 mm or larger are sufficient. Of course it is also possible to measure across the full width W and/or the full length L of the superconducting layer 3 to determine $I_c^{\parallel}$ and $I_c^{\perp}$.

The superconductor 1 can be used, in accordance with the invention, in an alternating magnetic field B (which is here an external field). The magnetic field B is here perpendicular to the substrate 2, and alternates with respect to its sign periodically (e.g. with 50-60 Hz).

Figure 5:
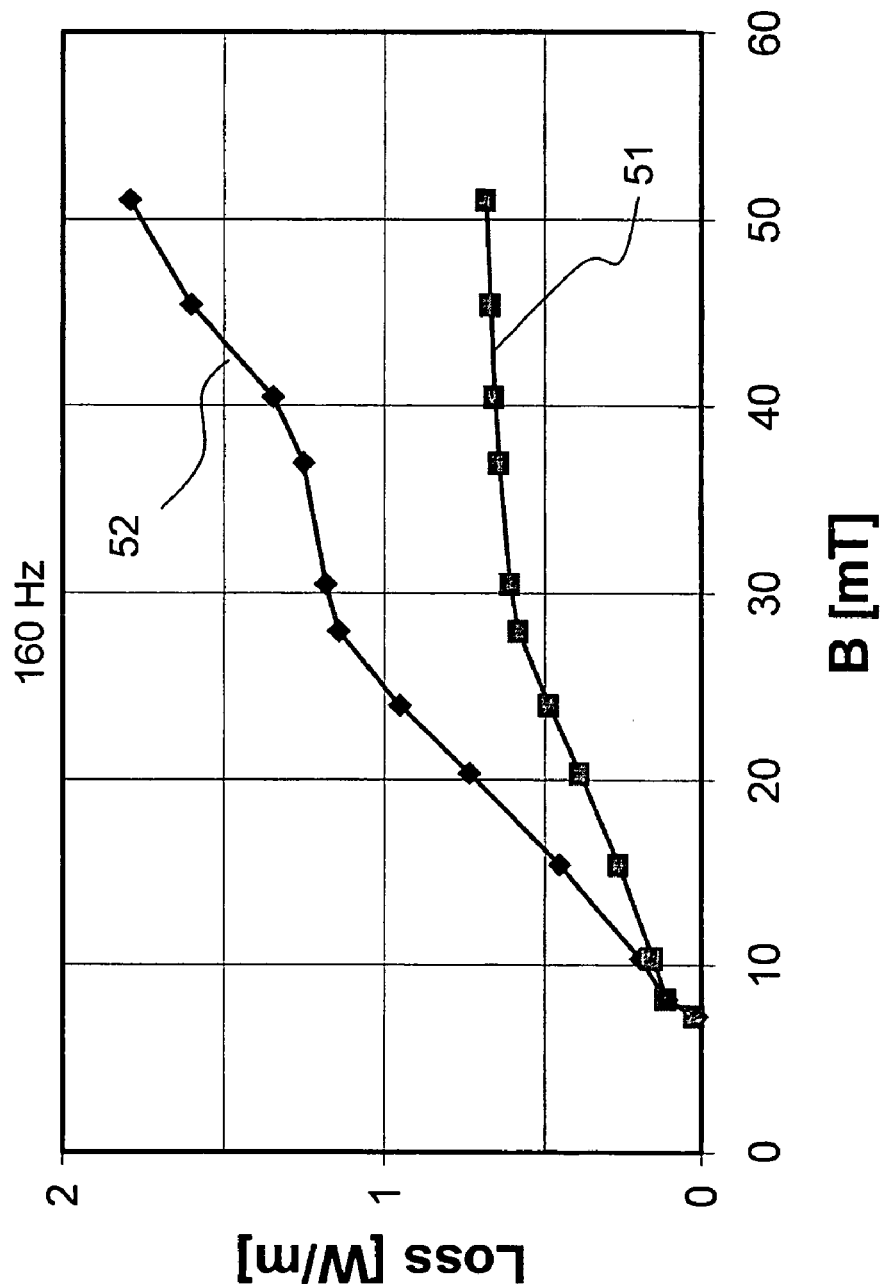
FIG. 5 shows a diagram of ac losses in an isotropic (state of the art) and an anisotropic (inventive) superconducting layer of a tape-type superconductor versus the strength of an external magnetic field alternating at 160 Hz.

The anisotropy of critical currents per unit width with respect to the parallel and the perpendicular in-plane directions leads to reduced losses in the superconductor 1 as compared to an isotropic superconducting layer of the same thickness, compare FIG. 5.

Figure 2:
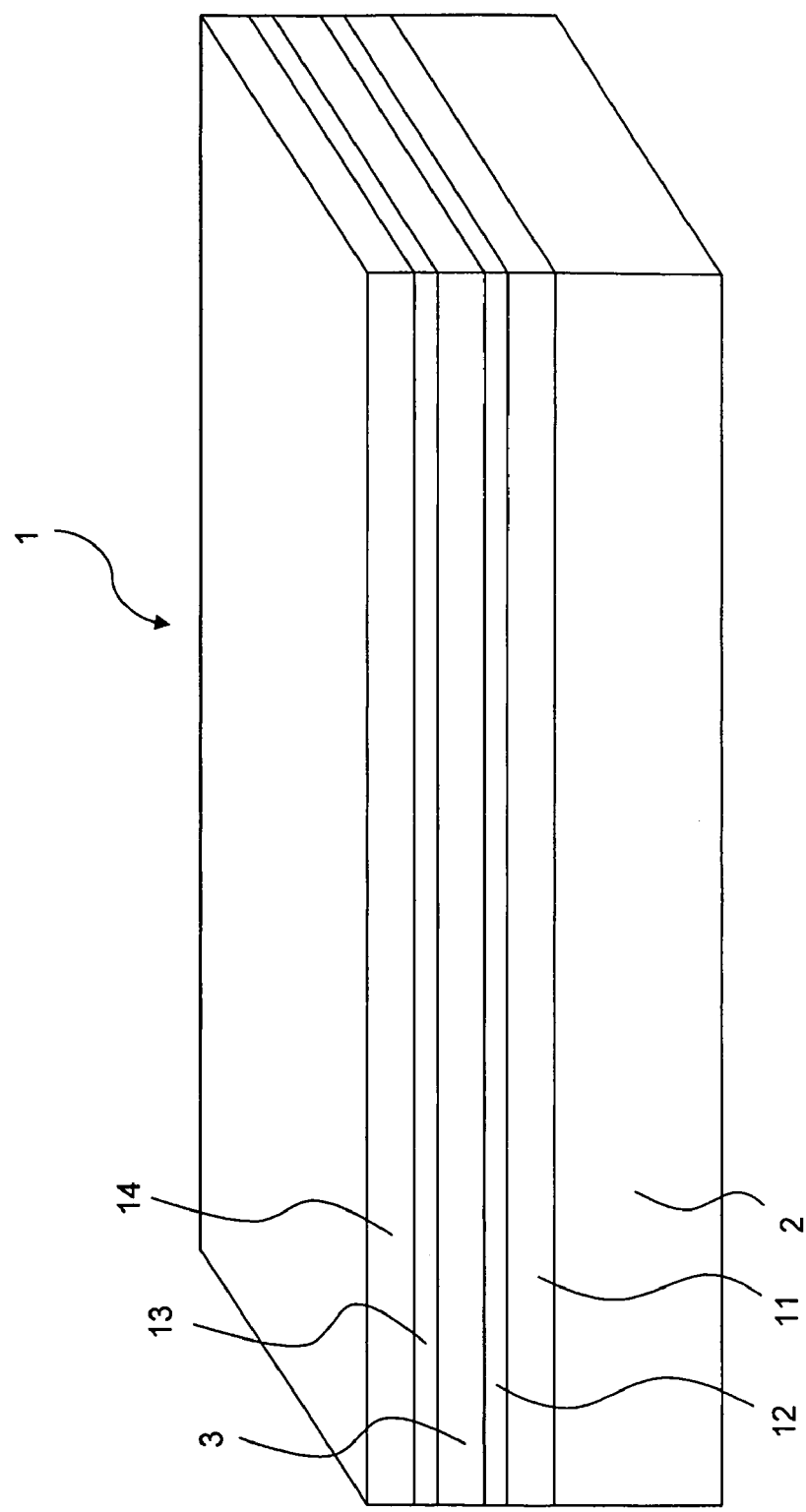
FIG. 2 shows schematically an inventive tape-type superconductor, including auxiliary layers.

FIG. 2 illustrates a typical inventive superconductor 1 (as introduced in FIG. 1) in more detail.

On the substrate 1, there is a buffer layer 11 (e.g. of yttria stabilized zirconia) deposited, which is in turn covered by a cap layer 12, e.g. of $CeO_2$. On top of the cap layer 12, there is the superconducting layer 3, e.g. made of YBCO. Then follows a protection layer 13, typically made of a noble metal such as gold. Finally, there is a Cu shunt layer 14, which typically contacts the substrate 2 (not shown here in detail).

Figure 3:
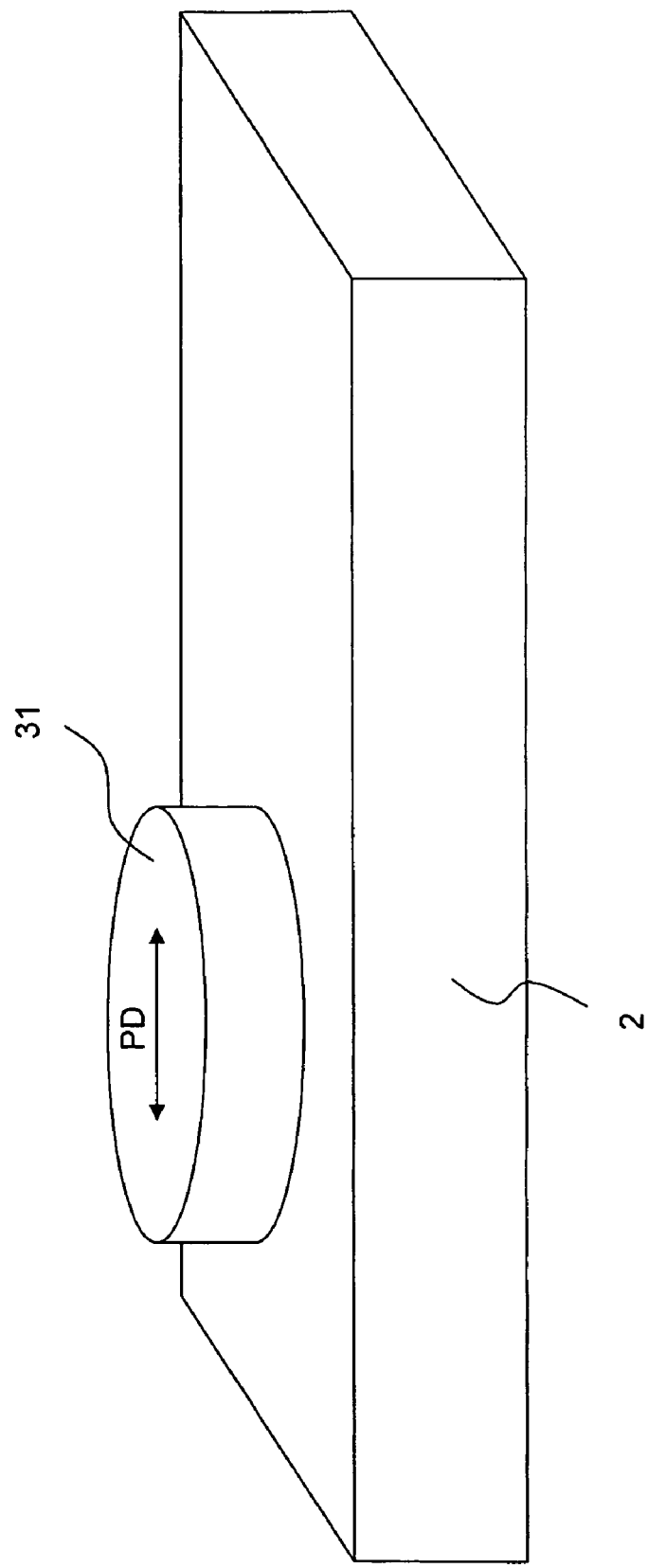
FIG. 3 illustrates a polishing procedure with a preferential direction for producing an inventive tape-type superconductor.

FIG. 3 illustrates a step in the preparation of an inventive anisotropic superconductor, namely a HTS coated conductor. The inventors found that polishing a steel substrate with a preferential direction results in an anisotropic superconducting layer as required for the present invention.

As substrate 2, a stainless steel tape of type Ni18Cr24 with a thickness of 100 μm was used. The substrate surface was polished using a cotton-silk polishing tool 31 with a water based emulsion of $Al_2O_3$ abrasives of sizes 3 μm, 1 μm and 0.5 μm. The polishing tool 31 was moved back and forth in only one direction, namely in parallel to the elongated direction of the substrate 2, compare arrow PD, with a pressure of 5-15 $N/cm^2$ to the substrate surface. At each abrasive grain size the polishing was continued until a saturation of surface roughness was achieved, and the abrasives were changed from high size to low size. At each abrasive change the substrate 2 was thoroughly washed with water and cleaned, and the polishing tools were renewed.

Figure 4:
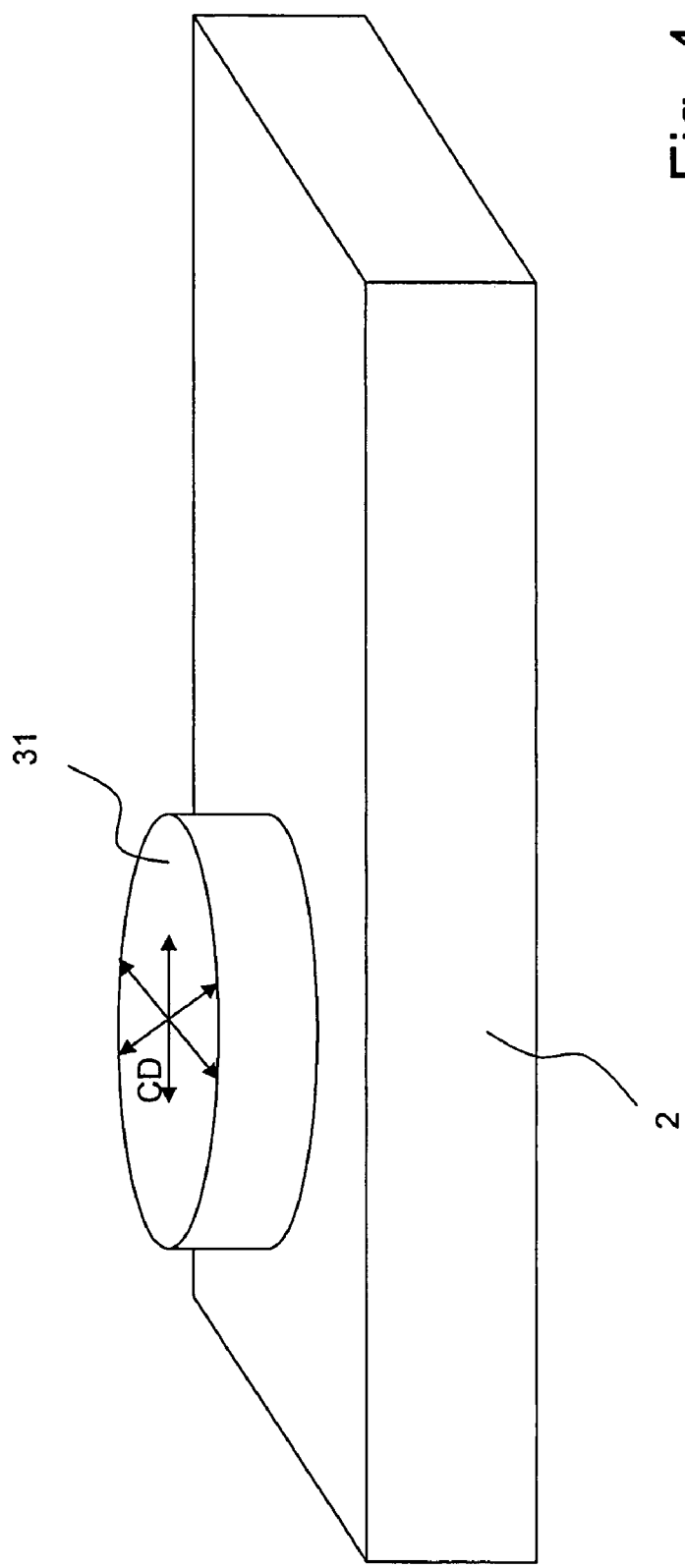
FIG. 4 illustrates an isotropic polishing procedure.

For the preparation of an isotropic superconductor for comparison, see FIG. 4, the polishing of the substrate 2 took place with a permanently changing back and forth direction of the polishing tool 31, compare arrows CD; for the rest the preparation procedure was analogous.

After polishing the substrate 2, a buffer layer was deposited, namely a film of yttria stabilized zirconia (6% yttria, and rest zirconia) of 1.5 μm thickness. The film was grown as a template under ABAD (alternate beam assisted deposition) conditions. A texture degree of FWHM=9.8° was achieved (for both superconductors).

On the buffer layer, a $CeO_2$ cap layer of 70 nm thickness was deposited by PLD (pulsed laser deposition). Then the superconductive layer of YBCO was deposited with a thickness of 2 μm vial PLD. On top of the superconductive layer, a protection layer of 0.3 μm thickness of gold was deposited by thermal vacuum evaporation. Finally, a Cu shunt layer of 20 μm thickness was deposited by galvanic plating.

The inventors believe that the preferential polishing direction establishes scratches in the substrate surface at which the deposited buffer layer is more likely to be locally misoriented, what then results in stripes of superconducting material of lower critical current density ("lower quality") deposited thereon; said stripes are embedded in superconducting material of regular critical current density ("normal quality"). The scratches are predominantly oriented along the elongated direction of the substrate, and so are the low critical current density stripes then. Macroscopically, this results in a reduced critical current per cm width perpendicular to the elongated substrate direction, whereas the critical current per cm width remains basically unchanged in parallel with the elongated substrate direction.

In FIG. 5, experimentally determined losses of the differently prepared tape-type superconductors are shown as a function of the strength of an external magnetic field alternating at 160 Hz and acting perpendicular to the tape-type superconductors. For the inventive superconductor with anisotropic substrate polishing, a ratio $I_c^\parallel/I_c^\perp$ of about 7 was measured. For the superconductor with isotropic polishing, a ratio $I_c^\parallel/I_c^\perp$ of about 1 was observed.

For low magnetic field strengths, losses of the inventive anisotropic superconductor are slightly above losses for the isotropic superconductor (the difference is small, not visible in FIG. 5). For higher magnetic fields, where losses are generally more severe, the situation is different. Here above about $8*10^{-3}$ T, the losses of the anisotropic superconductor (see 51) are about a factor of 2 below the losses of the isotropic superconductor (see 52).

Figure 6:
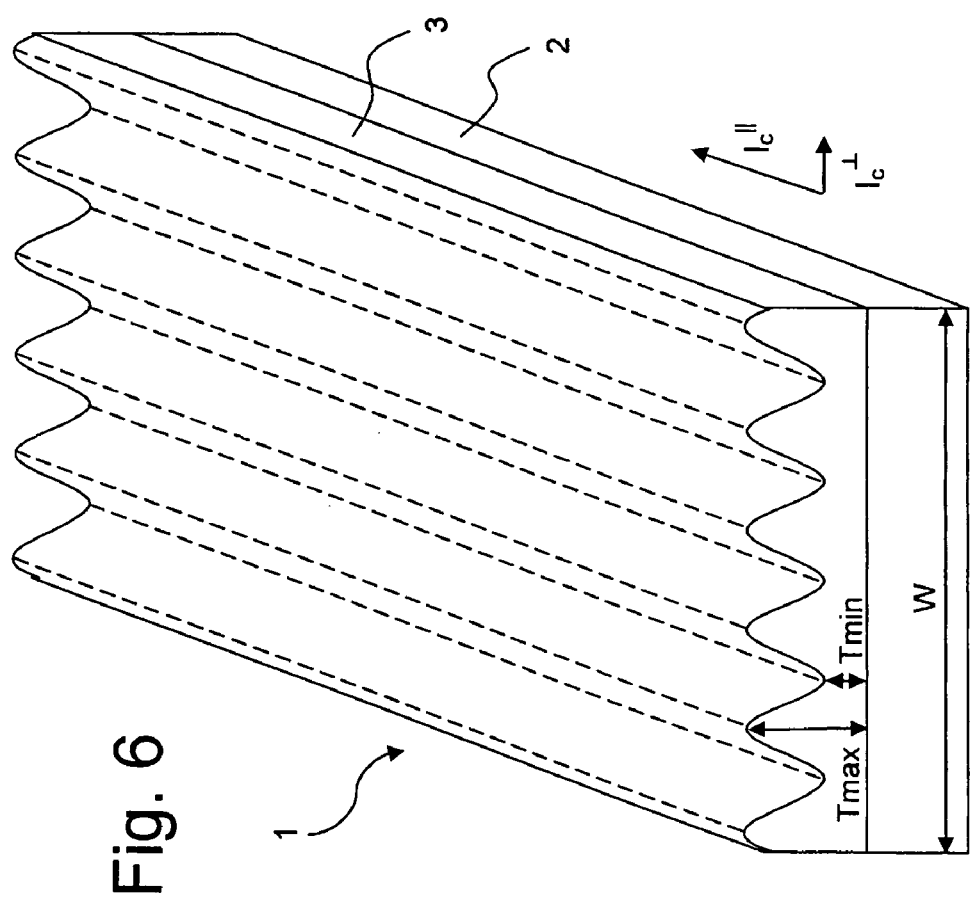
FIG. 6 shows in a schematic perspective view another embodiment of an inventive tape-type superconductor having a periodic thickness variation.

FIG. 6 illustrates another embodiment of an inventive tape-type superconductor 1, having a periodic thickness variation of a continuous superconducting layer 3, deposited on a substrate 2. Across the width W of the superconductor 1 (i.e. in the direction perpendicular to the elongated direction of the substrate 2), the thickness varies between a maximum thickness Tmax and a minimum thickness Tmin, with Tmin being about 0.4 times Tmax (i.e. the thickness variation is here 60% with respect to the maximum thickness). $I_c^\perp$ is limited by the regions of minimum thickness, whereas $I_c^\parallel$ can also benefit from the regions of maximum thickness, resulting in the inventive anisotropy.

In further applications the superconductor tape may be configured in different non-plane and non-straight forms. It may have form of helix, ring, especially sort-circuited ring, multilayered helical coil, pancake coil, spiral, etc.

We claim:

1. A tape-type superconductor, comprising:
   an elongated substrate or a metal tape; and
   a continuous superconducting layer or a continuous superconducting layer of an HTS type material, deposited on said substrate, wherein $I_c^\parallel/I_c^\perp \geq 1.5$, with $I_c^\parallel$ being a width density of critical current of said continuous superconducting layer in parallel to said substrate and in parallel to an elongated direction of said substrate, and with $I_c^\perp$ being a width density of critical current of said continuous superconducting layer in parallel to said substrate and perpendicular to said elongated direction of said substrate.

2. The tape-type superconductor of claim 1, wherein $I_c^\parallel/I_c^\perp \geq 3$, $I_c^\parallel/I_c^\perp \geq 5$ or $I_c^\parallel/I_c^\perp \geq 8$.

3. The tape-type superconductor of claim 1, wherein said continuous superconducting layer exhibits a maximum thickness variation of 30% or less, of 15% or less or of 5% or less, compared to a maximum thickness (Tmax).

4. The tape type superconductor of claim 1, wherein said continuous superconducting layer has a thickness variation or a periodic thickness variation in parallel to said substrate and perpendicular to said elongated direction of said substrate of at least 50%, at least 80% or at least 90%, as compared to a maximum thickness (Tmax).

5. The tape-type superconductor of claim 1, wherein said continuous superconducting layer has a thickness of 50 μm or less, of 10 μm or less or of 2 μm or less.

6. The tape-type superconductor of claim 1, wherein said continuous superconducting layer has a length (L) along said elongated direction of said substrate of 20 cm or more, of 1 m or more or of 100 m or more and a width (W) perpendicular to said elongated direction of said substrate of 1.5 mm or more, of 4 mm or more or of 12 mm or more.

7. The tape-type superconductor of claim 1, further comprising at least one buffer layer disposed between said elongated substrate and said continuous superconducting layer.

8. The tape-type superconductor of claim 7, wherein said at least one buffer layer comprises a dielectric, an insulating material, a material based on oxides or nitrides or yttria stabilized zirconia.

9. The tape-type superconductor of claim 1, wherein said continuous superconducting layer comprises $ReBa_2Cu_3O_{7-X}$, with Re being Y or a rare earth element.

10. The tape-type superconductor of claim 1, wherein said superconductor comprises a protection layer and/or a shunt layer.

11. The tape-type superconductor of claim 1, wherein said elongated substrate comprises a non-magnetic stainless steel tape.

12. The tape-type superconductor of claim 11, wherein said stainless steel tape is a CrNi stainless steel tape or a tape having a thickness of between 0.02 mm and 0.24 mm.

13. A method for using a superconductor, wherein the superconductor comprises a continuous superconducting layer or a layer of an HTS type material, deposited on a substrate, the method comprising the step of:
operating the superconductor in an alternating magnetic field B having a component perpendicular to the substrate, wherein the continuous superconducting layer has an anisotropy of width densities of critical current with respect to two orthogonal directions in parallel with the substrate of 1.5 or larger, of 3 or larger, of 5 or larger or of 8 or larger.

14. The method of claim 13, wherein the alternating magnetic field B originates at least partially from an ac current flow to which the superconductor is exposed.

15. The method of claim 13, wherein, at least in some areas around the superconductor, the alternating magnetic field B comprises an essential component that is perpendicular to the substrate.

16. The method of claim 13, wherein, under an effect of the alternating magnetic field B, a degree of anisotropy is larger as compared to without an effect of the alternating magnetic field B.

17. The method of claim 13, wherein the superconductor is used in an electrical rotating machine such as a motor or a generator, an electrical drive such as a linear motor, a transformer, a resistive or inductive superconducting fault current limiter, a superconducting magnet or a superconducting cable.

18. A method for designing AC losses of an alternating magnetic field B in a superconductor, wherein the superconductor comprises a continuous superconducting layer or a layer of a HTS type material deposited on a substrate and the alternating magnetic field B has a component perpendicular to the substrate, the method comprising the step of:
preparing the continuous superconducting layer with an anisotropy of width densities of critical current with respect to two orthogonal directions in parallel to the substrate such that a desired level of AC losses is achieved in the continuous superconducting layer.

* * * * *